United States Patent
Stancil (10) Patent No.: US 7,423,434 B2
(45) Date of Patent: Sep. 9, 2008

(54) CABLE PRESENCE DETECTION FOR DETECTING A CONNECTION BETWEEN TWO DEVICES

(75) Inventor: Charles J. Stancil, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 373 days.

(21) Appl. No.: 11/030,028

(22) Filed: Jan. 6, 2005

(65) Prior Publication Data

US 2006/0146485 A1    Jul. 6, 2006

(51) Int. Cl.
  *G01R 31/02* (2006.01)
  *G01R 19/00* (2006.01)
  *G06F 3/00* (2006.01)

(52) U.S. Cl. ............... 324/539; 324/66; 710/8

(58) Field of Classification Search ........... 324/66
  See application file for complete search history.

(56) References Cited

U.S. PATENT DOCUMENTS

| | | | |
|---|---|---|---|
| 5,384,540 A | 1/1995 | Dessel | |
| 6,194,965 B1 * | 2/2001 | Kruczkowski et al. | 330/258 |
| 6,223,229 B1 | 4/2001 | Kvamme | |
| 6,577,243 B1 * | 6/2003 | Dannenmann et al. | 340/815.45 |
| 6,906,526 B2 * | 6/2005 | Hart et al. | 324/527 |
| 7,049,937 B1 * | 5/2006 | Zweig et al. | 340/310.11 |
| 7,130,274 B2 * | 10/2006 | Chang et al. | 370/242 |
| 2004/0008462 A1 * | 1/2004 | Kluth et al. | 361/90 |
| 2004/0125927 A1 * | 7/2004 | Onken et al. | 379/106.01 |

OTHER PUBLICATIONS

Cisco Systems, Inc. "Cisco 800 Series ISDN Routers" 2002, pp. 1-12.*

PCI-SIG, PCI Express TM External Cabling Specification, Revision 0.3, Draft J, Apr. 21, 2004, pp. 1, 25-27.

* cited by examiner

*Primary Examiner*—Vincent Q. Nguyen
*Assistant Examiner*—Jeff Natalini (57) ABSTRACT

Systems, methodologies, media, and other embodiments associated with detecting devices connected to a cable are described. One exemplary system embodiment includes logic configured to determine whether devices are connected to a cable and are powered while maintaining ground isolation between the devices.

17 Claims, 5 Drawing Sheets

CABLE PRESENCE DETECTION FOR DETECTING A CONNECTION BETWEEN TWO DEVICES

BACKGROUND

To provide communications between devices, systems, or components, the devices can be connected together with a cable. In some applications, it may be desirable for one device to determine whether the cable is connected at its other end to another device and whether the other device is powered up. However, in a situation where the connected devices are to maintain ground isolation, determining whether a device is connected to the cable and powered involves additional considerations than in a system where ground isolation is not important.

Figure 1:
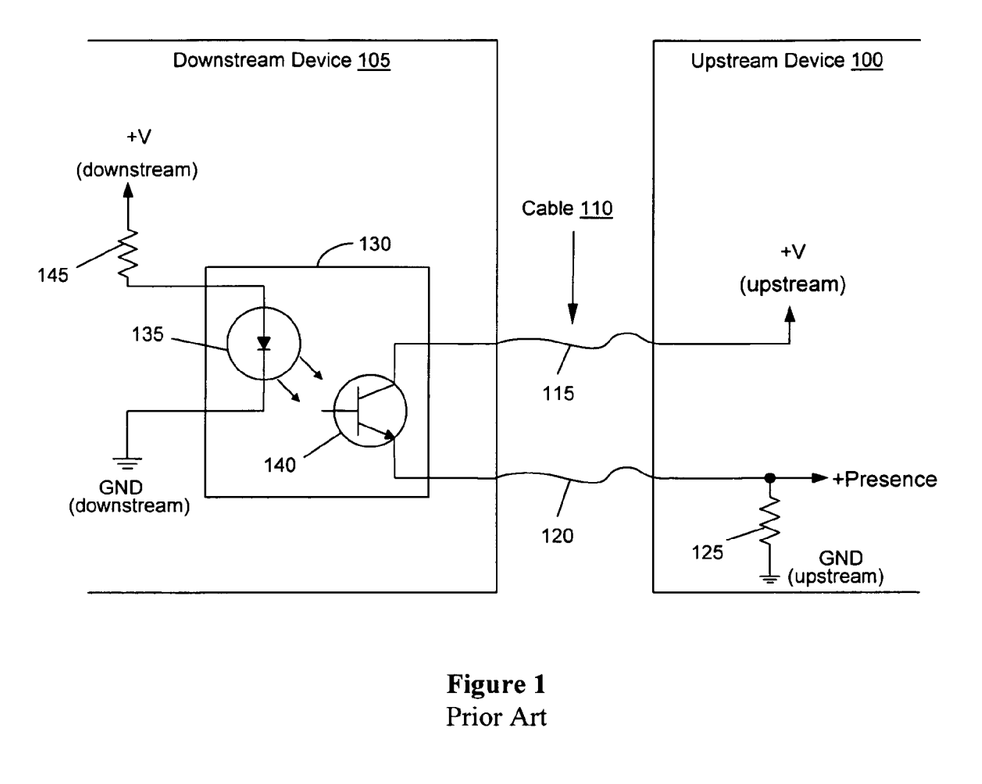
FIG. 1 illustrates a prior art system for one-directional detection.

With reference to FIG. 1, a prior art system is shown that is configured to allow an upstream device 100 to determine whether a downstream device 105 is connected to a cable 110 and is powered. The cable 110 is shown with only two signal paths or conductors 115 and 120 that are used for the detection process although the cable 110 will include one or more other conductors to facilitate data communication between the devices. For example, the conductor 115 is used to carry power (e.g. a voltage) from a voltage source on the upstream device 100 to the downstream device 105. The voltage source is labeled as "+V upstream." The conductor 120 is used to return a voltage signal to the upstream device 100 if the downstream device 105 is connected to the cable 110 and is powered. The returned voltage value can be read by the upstream device 100 as a value "+Presence" to determine whether the downstream device 105 is present and powered. The +Presence signal is connected through a pull-down resistor 125 to ground (GND) to stabilize the signal on conductor 120 in case the cable 110 is not connected. In this configuration, if the +Presence value is a logical high, this indicates that the downstream device 105 is connected and powered. If the +Presence value is a logic low, this means that the downstream device 105 is either not connected and/or not powered since the voltage from +V upstream is not conducted through the signal path 120.

Looking to the configuration of the downstream device 105, it is configured to return the voltage received on the signal path 115 back to the upstream device 100 along signal path 120. The voltage is returned along the signal path 120 only when the downstream device 105 is connected to the cable 110 and is powered. This is performed while maintaining ground isolation between the devices. In particular, the downstream device 105 includes an optical isolator 130 that is configured with a light-emitting diode 135 and a photo-sensor/phototransistor 140. The conductor 115 is connected to the collector of the phototransistor 140 and the conductor 120 is connected to the emitter of the phototransistor 140. The phototransistor 140 is configured such that when the diode 135 is in an off state, no light (or infrared) is detected by the phototransistor 140 causing the phototransistor to be in an off state. In the off state, the phototransistor 140 does not allow voltage/current to pass from the collector to the emitter, thus, no voltage/current is conducted to the signal path 120. The photodiode 135 is powered by a voltage source +V downstream from the downstream device 105 and is grounded to the downstream device 105. As such, ground isolation is maintained between the device 100 and the device 105. A current-limiting resistor 145 may be used to protect the light-emitting diode 135 from being overloaded.

With the system shown in FIG. 1, the upstream device 100 can detect whether the downstream device 105 is both connected to the cable 110 and is powered using the following scenario. Assuming that the downstream device 105 is connected to the cable 110 and is powered, power is supplied from the voltage source +V downstream that turns on the light-emitting diode 135, which in turn, causes the phototransistor 140 to turn on. In the on state, the phototransistor 140 allows voltage from the conductor 115 to pass through onto conductor 120 and be passed back to the upstream device 100. Voltage on the conductor 120 causes the value of +Presence to change from a logical low to a logical high, which indicates that the downstream device 105 is connected and powered. In either case where the downstream device 105 is not connected to the cable 110 or is not powered, the voltage from the conductor 115 does not reach the conductor 120 causing the value of the +Presence to be a logical low.

Although the system shown in FIG. 1 allows the upstream device 100 to detect whether the downstream device is connected and powered, it does not allow the downstream device 105 to determine whether the upstream device 100 is connected and powered. In some systems, it may be beneficial for both devices to determine if the other is connected and powered.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Example systems, methods, devices, and other embodiments are described herein that relate to cable presence detection. In one example embodiment, a system is configured to allow bi-directional presence detection that can determine whether both ends of a cable are connected to devices and whether those devices are powered. The detection is performed while maintaining ground isolation between the connected devices. Determining whether devices are connected to a cable and powered can be used to provide diagnostic information.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Computer-readable medium", as used herein, refers to a medium that participates in directly or indirectly providing signals, instructions and/or data. A computer-readable medium may take forms, including, but not limited to, non-volatile media, volatile media, and transmission media. Non-volatile media may include, for example, optical or magnetic disks and so on. Volatile media may include, for example, semiconductor memories, dynamic memory and the like. Transmission media may include coaxial cables, copper wire, fiber optic cables, and the like. Transmission media can also take the form of electromagnetic radiation, like that generated during radio-wave and infra-red data communications, or take the form of one or more groups of signals. Common forms of a computer-readable medium include, but are not limited to, a floppy disk, a flexible disk, a hard disk, a magnetic tape, other magnetic medium, a CD-ROM, other optical medium, punch cards, paper tape, other physical medium with patterns of holes, a RAM, a ROM, an EPROM, a FLASH-EPROM, or other memory chip or card, a memory stick, a carrier wave/pulse, and other media from which a computer, a processor or other electronic device can read. Signals used to propagate instructions or other software over a network, like the Internet, can be considered a "computer-readable medium."

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like an application specific integrated circuit (ASIC), an analog circuit, a digital circuit, a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like circuit components, a processor, operating system, a logic, software, or other entity. Logical and/or physical communication channels can be used to create an operable connection.

"Signal", as used herein, includes but is not limited to one or more electrical or optical signals, analog or digital signals, data, one or more computer or processor instructions, messages, a bit or bit stream, or other means that can be received, transmitted and/or detected.

"User", as used herein, includes but is not limited to one or more persons, software, computers or other devices, or combinations of these.

Figure 2:
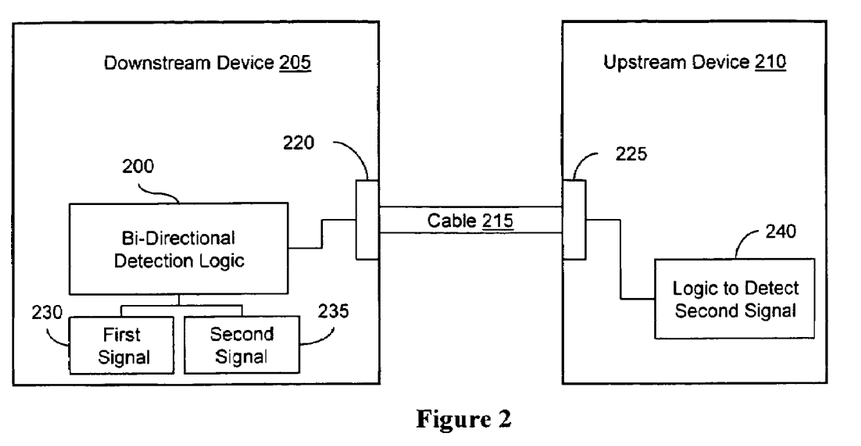
FIG. 2 illustrates one embodiment of a bi-directional detection logic.

FIG. 2 illustrates one embodiment of a detection logic 200 that is configured to facilitate bidirectional detection of whether a downstream device 205 and an upstream device 210 are connected to a cable 215 and are powered. The detection logic 200 may be configured within the downstream device 205 and operably connected to the cable 215 through a cable interface 220. The cable interface 220 can be, for example, a port, pin connectors, a receptacle, or other type of electrical connections capable of connecting with signal lines within the cable 215. The upstream device 210 can also include a cable interface 225 for connecting to the cable 215. In one example, the cable 215 is a PCI EXPRESS external cable. Of course, other types of cables such as serial, parallel, Universal Serial Bus (USB), Ethernet, or other desired type of cable could be used.

In one example, the detection logic 200 can be configured to generate a first signal 230 that is used to determine whether the upstream device 210 is connected to the cable and is powered. The detection logic 200 can also be configured to generate a second signal 235 that is transmitted back to the upstream device 210 to indicate whether the downstream device 205 is connected to the cable 215 and is powered. In that regard, the upstream device 210 can include a logic 240 that is configured to detect the second signal 235. In one example, the second signal 235 can be formed from a power signal from the upstream device 210.

In one embodiment, the bi-directional detection logic 200 can be configured within the downstream device 205 to generate the first signal 230 that indicates whether a power signal from the upstream device 210 is present from the cable 215 where the first signal 230 and the power signal are electrically isolated from each other. The bi-directional detection logic 200 can be further configured to generate the second signal 235 that indicates whether the downstream device 205 is connected and powered where the second signal 235 is configured to be transmitted over the cable 215 to the upstream device 210 while maintaining ground isolation between the two devices 205 and 210.

The detection logic 200 is configured to process/generate the first signal 230 and the second signal 235 while maintaining ground isolation between the downstream device 205 and the upstream device 210. Thus, the downstream device 205 does not directly measure power signals received from the upstream device 210 (and vice versa) without losing ground isolation. Example logic that can be used to process/generate the first and second signals include, but are not limited to, relays, optical isolators, and/or other isolating circuitry configured to maintain ground isolation. One example configuration is described with reference to FIG. 3.

Figure 3:
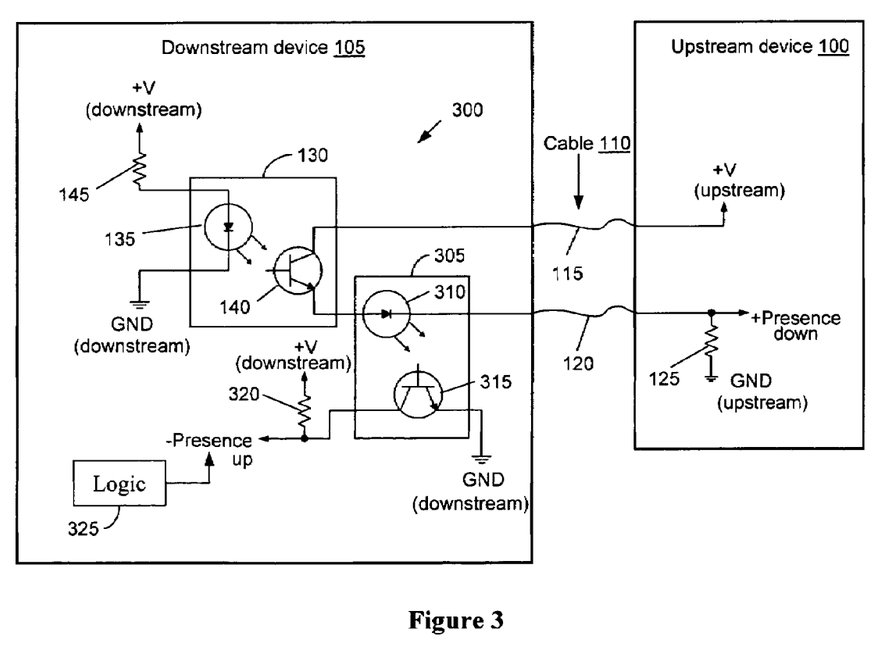
FIG. 3 illustrates another example embodiment of a bi-directional detection system.

Illustrated in FIG. 3 is one example embodiment of a cable presence detection system 300. The detection system 300 is an example circuit implementation that can be used for the bidirectional detection logic 200 illustrated in FIG. 2. It will be noted that the detection system 300 is shown as a modification to the system shown in FIG. 1. For ease of explanation, common components and reference numbers are used in FIG. 3 as in FIG. 1. As previously explained with reference to FIG. 1, the upstream device 100 is able to detect the presence of the downstream device 105 by reading the "+Presence down" signal, which is generated from its own voltage source (+V upstream). If the downstream device 105 is connected to the cable 110 and is powered (e.g. power applied to +V downstream), the phototransistor 140 connects signal line 115 to signal line 120 causing the voltage/current on the line to be returned to the upstream device 105.

In order for the downstream device 105 to detect whether the upstream device 100 is connected to the cable 110 and is powered, the detection system 300 includes a second optical isolator 305 that is configured to detect whether a signal is received from the upstream device 100. In this example, the signal received includes power (voltage/current) that is conducted over the conductor 115 from +V upstream. The optical isolator 305 is configured to generate a signal when power from the upstream device 100 is present while maintaining ground isolation between the devices.

In general, the optical isolator 130 or 305 (optoisolator), also known as an optical coupler or optocoupler, is a semiconductor device that allows signals to be transferred between circuits or systems, while keeping those circuits or systems electrically isolated from each other. In its simplest form, an optoisolator consists of a light-emitting diode (LED), IRED (infrared-emitting diode), or laser diode for signal transmission, and a photosensor for signal reception across an optical gap. In one form, the optoisolator can be enclosed in a single package, and has the appearance of an integrated circuit (IC) or a transistor with extra leads. The optical gap does not conduct electric current.

For example, the optical isolator 305 includes a diode 310 (e.g. light emitting, infrared, laser) that is powered by the upstream device 100 (e.g. +V upstream). If the power from the upstream device 100 is present, the diode 310 generates a signal (e.g. emits radiation) that is detected by a photosensor/phototransistor 315. The phototransistor 315, in one example, can have its emitter connected to ground GND of the downstream device. This causes the optical isolator 305 to function like a logical inverter. The phototransistor 315 can have its collector connected to a power source from the downstream device 105 (e.g. +V downstream) through a desired circuit. It will be appreciated that the two references to the "+V downstream" voltage sources in the downstream device 105 can be the same source or different sources. This also applies to the downstream ground GND.

In one example, a pull-up resistor 320 can be used to stabilize the signal outputted from the collector of the phototransistor 315, where the signal is labeled as "–Presence Up". The –Presence Up signal can be read by a logic 325 to determine whether it is a logic high or logic low. If the –Presence Up signal is a logic high (e.g. "1"), this indicates that the upstream device 100 is not connected and/or not powered. If the –Presence Up signal is a logic low (e.g. "0"), this indicates that the upstream device 100 is both connected and powered. Of course, the circuit can be configured so that opposite values are generated. For example, a logic high can indicate that the upstream device 100 is connected and is powered.

The following is an example of the functionality of the detection system 300. Consider the case where both the downstream device 105 and the upstream device 100 are connected to the cable 110 and both are powered. As such, +V downstream is supplying power to the diode 135 and +V upstream is supplying power onto signal line 115. The diode 135 is "on" and is emitting radiation that causes the phototransistor 140 to switch "on". In the "on" state, the voltage/current on the signal line 115 is passed through the phototransistor 140, which then powers the diode 310 in the optical isolator 305. Since the diode 310 is "on", the phototransistor 315 thus turns "on" and causes its circuit to be grounded (e.g. –Presence Up is connected to ground GND downstream). The –Presence Up signal becomes a logic low, which indicates that the upstream device 100 is connected and powered. Furthermore, the signal conductor 120 of the cable 110 conducts the voltage/current back to the upstream device 100, which causes the +Presence Down signal to raise to a logic high. This indicates that the downstream device 105 is connected and powered since the power from +V Upstream has been transmitted to and returned from the downstream device 105.

Another case is when the upstream device 100 is not connected, or is connected but not powered. In both cases, no voltage/current is present on the signal line 115. If the downstream device 105 is powered, the diode 135 is powered "on" and the phototransistor 140 is "on". However, no voltage/current will pass through the phototransistor 140 since there is no voltage/current on the signal line 115. Accordingly, the diode 310 receives no power, the phototransistor 315 is "off", and the "–Presence up" signal will be at a logic high (e.g. not grounded). This indicates to the downstream device 105 that the upstream device 100 is not connected, not powered, or both.

Another case is when the upstream device 100 is connected and powered, and the downstream device 105 is connected but is not powered. Here, voltage/current is present on the signal line 115. However, since the downstream device 105 is not powered, the diode 135 is "off" and the phototransistor 140 is "off". Thus, no voltage/current will pass through the phototransistor 140 even though there is voltage/current on the signal line 115. Accordingly, the diode 310 receives no power, and no voltage/current is transmitted back across the signal line 120 to the upstream device 100. The "+Presence down" signal is a logic low, which indicates that the downstream device 105 is not connected, not powered, or both. As for the "–Presence up" signal, since the downstream device 105 is not powered, its value is irrelevant. Other connection and power scenarios will be readily understood based on the illustrated examples.

In another embodiment, the optical isolator 305 may be configured such that the diode 310 is powered by the signal line 115. For example, the signal line 115 can be connected to power the diode 310 and the electrical output line from the diode 310 can be connected to the collector of the phototransistor 140. In general, the optical isolator 305 can be configured so that the diode 310 is powered by the upstream device 100. Thus, if power is received, then the upstream device 100 is connected to the cable 110 and is powered.

It will be appreciated that in other embodiments, one or both of the optical isolators 130, 305 can be configured using other designs. For example, additional photodiodes, photosensors, phototransistors, and/or other combinations of components can be used. Other components such as relays and/or electrical isolating circuitry can be used in combination with, or in place of, the optical isolators to provide ground isolation.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks. While the figures illustrate various actions occurring in serial, it is to be appreciated that various actions could occur concurrently, substantially in parallel, and/or at substantially different points in time.

Figure 4:
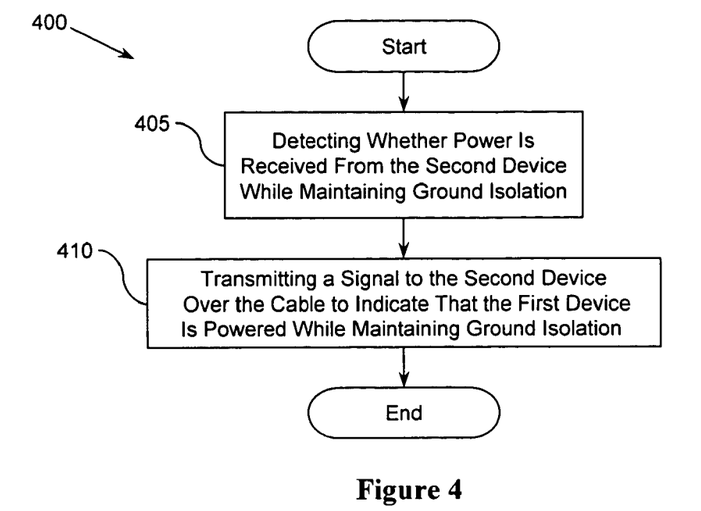
FIG. 4 illustrates an example method for determining a connection status of both ends of a cable.

Illustrated in FIG. 4 is an example methodology 400 that can be associated with a detecting whether two devices, components, systems, or other electrical devices are connected to each other over a cable and are powered. The illustrated elements denote "processing blocks" that may be implemented in logic. In one example, the processing blocks may represent executable instructions that cause a computer, processor, and/or logic device to respond, to perform an action (s), to change states, and/or to make decisions. Thus, the described methodologies can be implemented as processor executable instructions and/or operations provided by a computer-readable medium. In another example, the processing blocks may represent functions and/or actions performed by functionally equivalent circuits such as an analog circuit, a digital signal processor circuit, an application specific integrated circuit (ASIC), or other logic device. The diagram of FIG. 4, as well as the other illustrated diagrams, are not intended to limit the implementation of the described examples. Rather, the diagrams illustrate functional information one skilled in the art could use to design/fabricate circuits, generate software, or use a combination of hardware and software to perform the illustrated processing.

FIG. 4 illustrates the example method 400 for determining a powered status for a first device and a second device, which may be connected together via a cable, where the method 400 is performed by the first device. The example method 400 can include detecting whether power is received from the second device while maintaining ground isolation between the first device and the second device (block 405). The method 400 can also include transmitting a signal to the second device over the cable to indicate that the first device is powered while maintaining ground isolation between the first device and the second device (block 410). The method 400 is one example of how a device can facilitate bi-directional cable presence detection by determining whether both ends of the cable are connected to devices, and whether the devices are powered.

In another embodiment, the detecting block 405 can include powering a diode, within the first device, with power from the second device. The diode can be configured to activate a phototransistor when the diode is on, causing a signal to be generated in the first device that indicates that the second device is powered. Additionally, the signal is electrically isolated from the power of the second device. In another example, the transmitting block 410 can include forming the signal from the power of the second device. Thus, power can be received from the second device and returned to the second device by the first device when the first device is also powered. In this manner, the second device can determine that the first device is powered.

Figure 5:
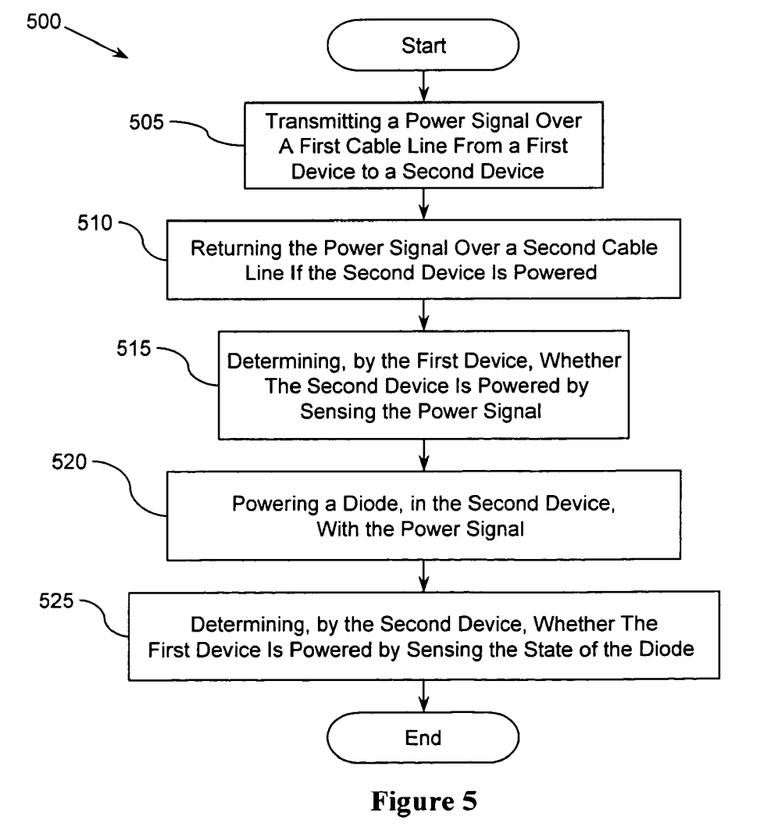
FIG. 5 illustrates another embodiment for a method associated with bidirectional cable presence detection.

Illustrated in FIG. 5 is another embodiment of a method 500 that can be associated with bidirectional cable presence detection. For example, the method 500 can include transmitting a power signal over a first cable line from a first device to a second device (block 505). The power signal can then be returned over a second cable line from the second device to the first device if the second device is powered while maintaining ground isolation between the first device and the second device (block 510). The first device can then determine whether the second device is powered by sensing the power signal from the second cable line (block 515).

The method 500 can also include powering a diode, in the second device, with the power signal from the first device (block 520). The diode can include a state including an on state when the power signal is present and an off state when the power signal is not present. The second device can then determine whether the first device is powered by sensing the state of the diode while maintaining ground isolation between the first device and the second device (block 525).

Figure 6:
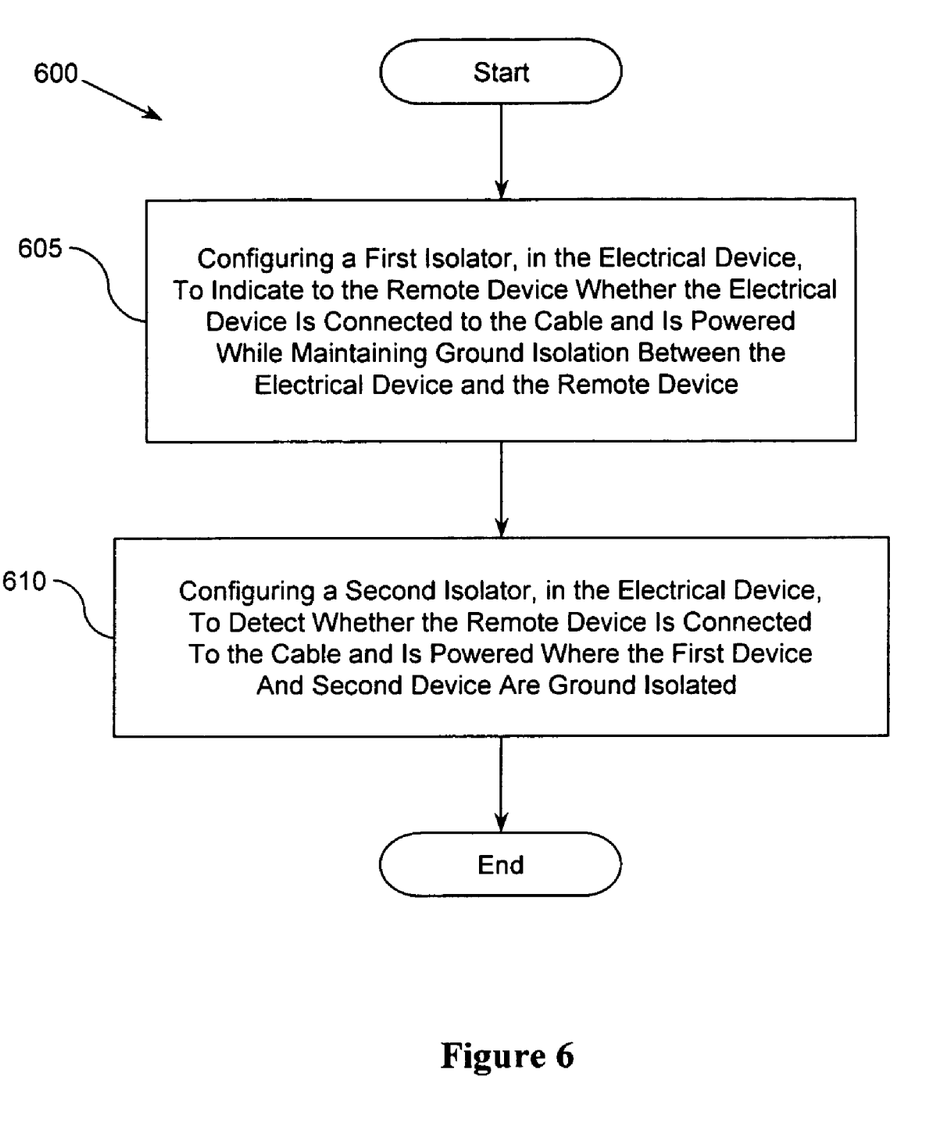
FIG. 6 illustrates an example embodiment for a method associated with manufacturing a device with the any of the example system described herein.

FIG. 6 illustrates another embodiment of a method 600 that can be associated with manufacturing an electrical device for indicating connectivity over a cable between the electrical device and a remote device. The method 600 can include configuring a first isolator, in the electrical device, to indicate to the remote device whether the electrical device is connected to the cable and is powered while maintaining ground isolation between the electrical device and the remove device (block 605). The method 600 can also include configuring a second isolator, in the electrical device, to detect whether the remote device is connected to the cable and is powered where the first device and second device are ground isolated (block 610).

In one embodiment, the electrical device can be manufactured with the system 300 shown in FIG. 3, or using equivalent circuits or logics. For example with reference to FIG. 3, if the first isolator is similar to optical isolator 130 that includes a first phototransistor 140 and a first diode 135, the method 600 can further include operatively connecting the first phototransistor 140 to receive a power signal from the remote device (e.g. upstream device 100) over a first cable line 115, where the power signal is conducted back to the remote device over a second cable line 120 based on a state of the first diode 135. The first diode 135 can be operatively connected to be powered by the electrical device (e.g. +V downstream).

Regarding the connectivity of the second isolator, it may be similar to optical isolator 310 that includes a second diode 310 and a second phototransistor 315. The method 600 can further include operatively connecting the second diode 310 to be powered by the remote device where the second diode 310 controls a state of the second phototransistor 315. The second phototransistor 315 can be operatively connected to generate a status signal (e.g. −Presence up) based on the state of the phototransistor 315. The status signal can then be used to indicate whether the remote device is connected to the cable and is powered. Of course, one of ordinary skill in the art can operatively connect circuit components in other ways and configure other electrical/ground isolating circuits to achieve the bidirectional detection.

Figure 7:
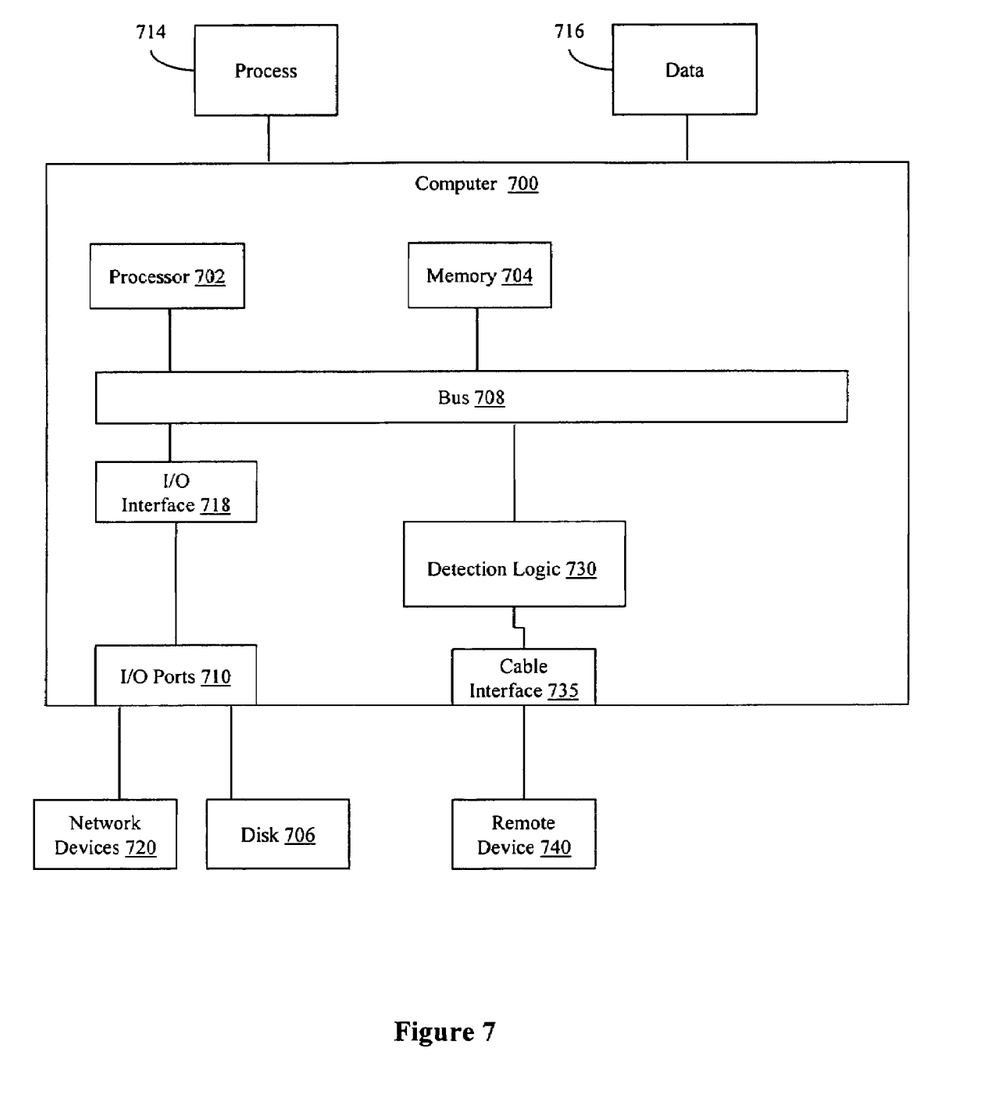
FIG. 7 illustrates an example computing environment or electrical device in which example systems and methods illustrated herein can operate.

FIG. 7 illustrates an example computing device in which example systems and methods described herein, and equivalents, can operate. Of course, other types of electrical devices may include fewer components than those illustrated, or additional components. The example computing device may be a computer 700 that includes a processor 702, a memory 704, and input/output ports 710 operably connected by a bus 708. In one example, the computer 700 may include a detection logic 730 configured to facilitate detecting a connection status of both ends of a cable 735 including whether the computer 700 and a remote device 740 are powered. The detection logic 735 can be implemented similar to the bi-directional detection logic 200 shown in FIG. 2, the detection system 300 shown in FIG. 3, and/or the other systems and methods described herein.

Generally describing an example configuration of the computer 700, the processor 702 can be a variety of various processors including dual microprocessor and other multi-processor architectures. The memory 704 can include volatile memory and/or non-volatile memory. The non-volatile memory can include, but is not limited to, ROM, PROM, EPROM, EEPROM, and the like. Volatile memory can include, for example, RAM, synchronous RAM (SRAM), dynamic RAM (DRAM), synchronous DRAM (SDRAM), double data rate SDRAM (DDR SDRAM), and direct RAM bus RAM (DRRAM).

A disk 706 may be operably connected to the computer 700 via, for example, an input/output interface (e.g., card, device) 718 and an input/output port 710. The disk 706 can include, but is not limited to, devices like a magnetic disk drive, a solid state disk drive, a floppy disk drive, a tape drive, a Zip drive, a flash memory card, and/or a memory stick. Furthermore, the disk 706 can include optical drives like a CD-ROM, a CD recordable drive (CD-R drive), a CD rewriteable drive (CD-RW drive), and/or a digital video ROM drive (DVD ROM). The memory 704 can store processes 714 and/or data 716, for example. The disk 706 and/or memory 704 can store an operating system that controls and allocates resources of the computer 700.

The bus 708 can be a single internal bus interconnect architecture and/or other bus or mesh architectures. While a single bus is illustrated, it is to be appreciated that computer 700 may communicate with various devices, logics, and peripherals using other busses that are not illustrated (e.g., PCI Express, SATA, Infiniband, 1394, USB, Ethernet). The bus 708 can be of a variety of types including, but not limited to, a memory bus or memory controller, a peripheral bus or external bus, a crossbar switch, and/or a local bus. The local bus can be of varieties including, but not limited to, an industrial standard architecture (ISA) bus, a microchannel architecture (MSA) bus, an extended ISA (EISA) bus, a peripheral component interconnect (PCI) bus, a universal serial (USB) bus, and a small computer systems interface (SCSI) bus.

The computer 700 may interact with input/output devices via i/o interfaces 718 and input/output ports 710. Input/output devices can include, but are not limited to, a keyboard, a microphone, a pointing and selection device, cameras, video cards, displays, disk 706, network devices 720, and the like. The input/output ports 710 can include but are not limited to, serial ports, parallel ports, and USB ports.

The computer 700 can operate in a network environment and thus may be connected to network devices 720 via the i/o devices 718, and/or the i/o ports 710. Through the network devices 720, the computer 700 may interact with a network. Through the network, the computer 700 may be logically connected to remote computers. The networks with which the computer 700 may interact include, but are not limited to, a local area network (LAN), a wide area network (WAN), and other networks. The network devices 720 can connect to LAN technologies including, but not limited to, fiber distributed data interface (FDDI), copper distributed data interface (CDDI), Ethernet (IEEE 802.3), token ring (IEEE 802.5), wireless computer communication (IEEE 802.11), Bluetooth (IEEE 802.15.1), and the like. Similarly, the network devices 720 can connect to WAN technologies including, but not limited to, point to point links, circuit switching networks like integrated services digital networks (ISDN), packet switching networks, and digital subscriber lines (DSL).

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A system for detecting a cable connection between a first device and a second device, the system comprising:
    a bi-directional detection logic configured within the first device to generate a first signal that indicates whether a power signal from the second device is present from the cable where the first signal and the power signal are electrically isolated from each other; and
    the bi-directional detection logic being further configured to generate a second signal that indicates whether the first device is connected and powered where the second signal is configured to be transmitted over the cable to the second device while maintaining ground isolation between the first device and the second device;
    where the bidirectional detection logic includes:
    a first optical isolator including a diode configured to be powered by the power signal of the second device, and including a phototransistor configured to generate the first signal while electrically isolating the first signal from the power signal of the second device;
    and a second optical isolator including a diode configured to be powered by the first device, and including a phototransistor configured to conduct the power signal back to the second device through the cable if the diode is powered.

2. The system of claim 1 where the second signal is formed from the power signal of the second device.

3. The system of claim 1 where the first signal is configured to be used by the first device to determine whether the second device is connected to the cable and is powered, and where the second signal is configured to be used by the second device to determine whether the first device is connected to the cable and is powered.

4. The system of claim 1 where bi-directional logic is configured to communicate with the cable being one of: a PCI Express cable, a serial cable, a Universal Serial Bus cable, and an Ethernet cable.

5. The system of claim 1 where the bi-directional logic includes:
    means for generating the first signal that indicates whether the power signal from the second device is present from the cable; and
    means for generating the second signal that indicates whether the first device is connected and powered, while maintaining ground isolation between the first device and the second device.

6. The system of claim 1, where the cable includes:
    a first signal line configured to conduct the power signal from the second device to the first device; and
    a second signal line configured to conduct the second signal from the first device to the second device.

7. A method of manufacturing an electrical device for indicating connectivity over a cable between the electrical device and a remote device, the method comprising:
configuring a first isolator, in the electrical device, to indicate to the remote device whether the electrical device is connected to the cable and is powered while maintaining ground isolation between the electrical device and the remove device; and
configuring a second isolator, in the electrical device, to detect whether the remote device is connected to the cable and is powered where the electrical device and remote device are ground isolated;
where the first isolator includes an optical isolator having a first phototransistor and a first diode, the method further including:
operatively connecting the first phototransistor to receive a power signal from the remote device over a first cable line, where the power signal is conducted back to the remote device over a second cable line based on a state of the first diode;
and operatively connecting the first diode to be powered by the electrical device.

8. The method of claim 7 where the second isolator includes an optical isolator having a second diode and a second phototransistor, the method further including:
operatively connecting the second diode to be powered by the remote device where the second diode controls a state of the second phototransistor; and
operatively connecting the second phototransistor to generate a status signal based on the state of the phototransistor, the status signal used to indicate whether the remote device is connected to the cable and is powered.

9. A electrical device configured to detect whether a remote device is connected thereto by a cable, the electrical device comprising:
a first optical isolator including:
a first diode configured to be powered by the electrical device; and
a first phototransistor being operatively connected to receive power from the remote device over a first signal line of the cable, and when the first diode is powered, the first phototransistor is configured to conduct the power onto a second signal line of the cable as a first output signal back to the remote device, and when the first diode is not powered, the first phototransistor is configured to not conduct the power to the second signal line where the first output signal on the second signal line is used by the remote device to determine whether the electrical device is connected to the cable and is powered;
a second optical isolator including:
a second diode configured to be powered by the remote device; and
a second phototransistor having an emitter being operatively connected to a ground of the electrical device and having a collector operatively connected to a power source of the electrical device to produce a second output signal, where the second phototransistor is in an off state when the second diode is not powered and is in an on state when the second diode is powered;
a logic configured to sense the second output signal to determine whether the remote device is connected to the cable and is powered; and
where the electrical device and the remote device are ground isolated.

10. The electrical device of claim 9 where the second diode is configured to receive power from the remote device from an emitter of the first phototransistor.

11. The electrical device of claim 9 where the first output signal and the second output signal provide for bi-directional presence detection of the electrical device and the remote device.

12. The electrical device of claim 9 where the cable includes a cable compatible with PCI Express.

13. A method comprising:
transmitting a power signal over a first cable line from a first device to a second device;
returning the power signal over a second cable line from the second device to the first device if the second device is powered while maintaining ground isolation between the first device and the second device;
determining, by the first device, whether the second device is powered by sensing the power signal from the second cable line;
powering a diode, in the second device, with the power signal from the first device where the diode includes a state including an on state when the power signal is present and an off state when the power signal is not present; and
determining, by the second device, whether the first device is powered by sensing the state of the diode while maintaining ground isolation between the first device and the second device.

14. A system, comprising:
means for determining, in a first device, whether a second device is connected to a cable means with the first device and is powered while maintaining ground isolation between the first device and the second device; and
means for indicating to the second device whether the first device is connected to the cable means and is powered while maintaining ground isolation between the first device and the second device;
where the means for indicating include a first optical isolator including a first diode configured to be powered by the first device and a first phototransistor operatively connected to receive power from the second device over a first signal line of the cable, and when the first diode is powered, the first phototransistor is configured to conduct the power onto a second signal line of the cable as a first output signal back to the second device, and when the first diode is not powered, the first phototransistor is configured to not conduct the power to the second signal line where the first output signal on the second signal line is used by the second device to determine whether the first device is connected to the cable and is powered.

15. The system of claim 14 where the cable means includes a PCI Express cable.

16. The system of claim 14 where the means for determining includes an optical isolator.

17. The system of claim 14 where the means for determining and the means for indicating include circuitry configured with one or more of: relays, electrical isolation circuits, optical isolators, and combinations thereof.

* * * * *

UNITED STATES PATENT AND TRADEMARK OFFICE
CERTIFICATE OF CORRECTION

| | | |
|---|---|---|
| PATENT NO. | : 7,423,434 B2 | Page 1 of 1 |
| APPLICATION NO. | : 11/030028 | |
| DATED | : September 9, 2008 | |
| INVENTOR(S) | : Charles J. Stancil | |

It is certified that error appears in the above-identified patent and that said Letters Patent is hereby corrected as shown below:

On the Title Page:
Item (54), delete "CABLE PRESENCE DETECTION FOR DETECTING A CONNECTION BETWEEN TWO DEVICES" and insert -- CABLE PRESENCE DETECTION --, therefor.

In column 1, lines 1-3, delete "CABLE PRESENCE DETECTION FOR DETECTING A CONNECTION BETWEEN TWO DEVICES" and insert -- CABLE PRESENCE DETECTION --, therefor.

In the Claims:
In column 10, line 30, in Claim 1, delete "bidirectional" and insert -- bi-directional --, therefor.

In column 11, line 8, in Claim 7, delete "remove" and insert -- remote --, therefor.

In column 12, line 43, in Claim 14, delete "device" and insert -- device, --, therefor.

Signed and Sealed this

Fourteenth Day of September, 2010

David J. Kappos
*Director of the United States Patent and Trademark Office*